United States Patent
Heaney et al.

(10) Patent No.: US 9,524,985 B2
(45) Date of Patent: Dec. 20, 2016

(54) SWITCHING SYSTEM AND METHOD

(75) Inventors: Eugene Heaney, Cork (IE); John O'Sullivan, Cork (IE); Stephen Keeney, Cork (IE)

(73) Assignee: Ferfics Limited, Cork (IE)

( * ) Notice: Subject to any disclaimer, the term of this patent is extended or adjusted under 35 U.S.C. 154(b) by 733 days.

(21) Appl. No.: 13/501,902

(22) PCT Filed: Oct. 18, 2010

(86) PCT No.: PCT/EP2010/065653
§ 371 (c)(1),
(2), (4) Date: Sep. 26, 2012

(87) PCT Pub. No.: WO2011/045442
PCT Pub. Date: Apr. 21, 2011

(65) Prior Publication Data
US 2013/0009725 A1    Jan. 10, 2013

(30) Foreign Application Priority Data
Oct. 16, 2009   (EP) .................................... 09173273

(51) Int. Cl.
H03K 17/30 (2006.01)
H01L 27/12 (2006.01)
(Continued)

(52) U.S. Cl.
CPC .......... H01L 27/1203 (2013.01); H01L 21/84 (2013.01); H01L 23/66 (2013.01);
(Continued)

(58) Field of Classification Search
CPC   H03K 17/6872; H03K 17/687; H03K 17/162; H03K 17/693; H03K 19/00361; H01H 11/00; H04B 1/44; H04B 1/48; H01P 1/15
(Continued)

(56) References Cited

U.S. PATENT DOCUMENTS 6,804,502 B2 * 10/2004 Burgener et al. ............. 455/333
7,205,190 B2    4/2007 Okihara
(Continued)

FOREIGN PATENT DOCUMENTS

WO    WO2008057524 A1    5/2008

OTHER PUBLICATIONS

Botula, A., et al., "A Thin-Film SOI 180nm CMOS RF Switch Technology", Silicon Monolithic Integrated Circuits in RF Systems, 2009, SIRF '09, IEEE Topical Meeting on, IEEE, Piscataway, New Jersey, USA, Jan. 19, 2009, pp. 1-4.*
(Continued)

*Primary Examiner* — Lincoln Donovan
*Assistant Examiner* — Thomas Skibinski
(74) *Attorney, Agent, or Firm* — K&L Gates LLP

(57)    ABSTRACT

The invention relates to a Radio Frequency System and method. A Radio Frequency (RF) system comprising a RF switch comprising a plurality of transistor switching elements implemented on Silicon on Insulator (SOI) for switching at least one or more RF signals and said SOI comprises a bulk substrate region and a buried oxide region. At least one filter is adapted to isolate the RF signal from the substrate and/or other high frequency signals or control signals present in the RF system. There is also provided a coupling capacitor adapted to cooperate with the filter to improve linearity of the transistor switch elements.

23 Claims, 13 Drawing Sheets

(51) Int. Cl.
*H01L 21/84* (2006.01)
*H01L 23/66* (2006.01)
*H01L 29/786* (2006.01)
*H03K 17/693* (2006.01)

(52) U.S. Cl.
CPC ..... *H01L 29/78606* (2013.01); *H03K 17/693* (2013.01); *H01L 2223/6644* (2013.01); *H01L 2223/6655* (2013.01); *H01L 2924/0002* (2013.01); *H03K 2217/0054* (2013.01)

(58) Field of Classification Search
USPC ............... 327/379–382, 384, 434, 436, 437, 427,327/551, 534, 564, 306–311, 313; 333/103, 333/101, 126, 262, 104, 133; 438/473; 257/E21.317; 455/552.1, 78, 80, 82, 83
See application file for complete search history.

(56) References Cited

U.S. PATENT DOCUMENTS

| 7,459,988 | B1* | 12/2008 | Iversen | 333/103 |
| 2007/0018247 | A1* | 1/2007 | Brindle et al. | 257/347 |
| 2009/0085690 | A1* | 4/2009 | Takeuchi | H03K 19/00346 333/103 |
| 2010/0225378 | A1 | 9/2010 | Nakatsuka et al. | |

OTHER PUBLICATIONS

Botula et al. "A Thin-Film SOI 180nm CMOS RF Switch Technology," Silicon Monolithic Integrated Circuits in RF Systems, 2009, SIRF '09, IEEE Topical Meeting on, IEEE, Piscataway, New Jersey, USA; Jan. 19, 2009, pp. 1-4.

PCT International Search Report and Written Opinion of the International Searching Authority for International Patent Application No. PCT/EP2010/065653, mailed Apr. 6, 2011, 12 pages.

* cited by examiner

Location of Trench Implant layer

SWITCHING SYSTEM AND METHOD

CROSS REFERENCE TO RELATED APPLICATIONS

This application is a national phase application under 35 U.S.C. §371 of International Application No. PCT/EP2010/065653, filed on Oct. 18, 2010, which claims priority to and the benefit of European Patent Application No. 09173273.5 filed on Oct. 16, 2009, the entire disclosures of each of which are incorporated by reference herein.

FIELD OF THE INVENTION

The present invention generally relates to the field of semiconductors and RF systems. In particular, the invention relates to RF switches and to switching radio frequency (RF) signals within an integrated circuit.

BACKGROUND TO THE INVENTION

RF switches are a key building block in wireless systems and find many uses in applications such as mobile phones and wireless LANS. The act of switching radio frequency signals in an integrated circuit is carried out by an RF switch circuit. Many technologies exist for the design of integrated RF switch circuits.

Generally an RF switch system does not consist of the RF switching circuit alone and typically must be controlled using digital logic circuitry. In addition both negative and positive voltage levels are required to optimise the performance of the switch. Therefore, a negative voltage generator may also be required as part of the switch system. A switch can have a number of switching elements, although it can be comprised of any number of switching elements, which control the flow of RF power between different points in the particular application. Often MOSFET switches are used as the switching element in the art of RF design.

Performance metrics such as low insertion loss, high linearity, high isolation and power handling are critical in RF switch design. However, the RF switch performance is limited by substrate interactions with the circuits which degrade all the key performance metrics as well as non-linearities in the circuits themselves. Switching to an SOI substrate has been shown to improve the loss in the substrate although additional treatment of the silicon substrate is necessary to improve linearity. This has been achieved using an implant step in the process which prevents charge build-up at the silicon surface beneath the oxide. However, these steps are still not sufficient to meet the stringent demands of wireless technologies and further techniques are required to serve the broader wireless market segment.

A publication by Botula A et al entitled 'A Thin Film SOI 190 nm CMOS RF Switch Technology, IEEE, Piscataway, N.J., USA, 19 Jan. 2009, XP031415569 discloses a thin film SOI technology developed for RF switch applications and provides a buffer to protect the circuits from the RF signals. Other publications include WO2008/057524 assigned to Skyworks Solutions Inc., US2003/090313, Burgener et al, and US 2005/176184, Okihara Masao. However, none of the RF designs disclosed in these publications deal with the problem of unintended interactions of the RF and/or DC (or control) signals which are present, by injection of RF signals into the DC and low frequency analog blocks or by direct coupling of the wires on an IC chip. If a portion of the RF signal becomes inadvertently superimposed on the DC bias signals it degrades the linearity of the circuits making them unsuitable for wireless applications that demand low harmonic distortion.

One solution to the substrate interaction problem involves using an alternative substrate material such as sapphire. However, this significantly increases manufacturing costs and may not completely solve the interaction of RF and DC signals. Another solution involves the use of III-V technologies such as GaAs but this also increases costs and decreases integration levels.

There is therefore a need to provide a RF switch system, method and architecture to overcome the above mentioned problems.

SUMMARY OF THE INVENTION

According to the present invention there is provided, as set out in the appended claims, a Radio Frequency (RF) system and method comprising:
  a RF switch comprising a plurality of transistor switching elements implemented on Silicon on Insulator (SOI) for switching at least one or more RF signals;
  said SOI comprises a bulk substrate region and a buried oxide region;
  characterised by:
  at least one filter adapted to isolate the RF signal from the substrate and/or other high frequency signals or control signals present in the RF system.

The advantage of the invention is that the filter eliminates any possibility of coupling to neighbouring bias lines or the substrate which will result in superior linearity in the RF switch and reduce any RF swing that is associated with prior art RF switches. The system provides flexibility in how bias lines are routed on an IC chip and can save die area on larger switches since isolation between the bias lines can still be achieved without taking precautions to space them far apart or shield them from one another.

In one embodiment there is provided a coupling capacitor adapted to cooperate with said at least one filter to improve linearity of the transistor switch elements.

In one embodiment the at least one filter is coupled to a gate bias line of at least one of said transistor switching elements.

In one embodiment there is provided a trench implant layer adapted with means for capturing free carriers at the interface between the bulk substrate region and buried oxide region.

In one embodiment the at least one filter is coupled to a gate bias line and body bias line of at least one of said transistor switching elements.

In one embodiment both the gate and body bias signals are connected to a filter which is connected to a bias resistor and connected to the source or drain of the switch transistor through a capacitor. This has the effect of filtering the rf signal from the control line outside the bias resistor preventing coupling to the substrate and neighbouring signals while allowing the rf signal to couple locally to the gate and body of the switch transistor to improve it's linearity.

In one embodiment the filters are located in close proximity to the negative voltage generator and digital control block to prevent injection of the RF signal from the transistor bias signals into these circuits causing non-linearities.

In one embodiment the filters are distributed across the RF system along with the switches to the DC supplies so that filtering occurs directly at the switch arm which eliminates the need to bus control signals with RF power superimposed across the RF system preventing injection of the RF power into the substrate as well as preventing coupling between control lines which will improve linearity.

In another embodiment partial filtering occurs locally at the at least one transistor and further filtering occurs at the digital block and negative voltage generator circuit blocks.

In another embodiment the width of the first and last transistor in the switch arm is reduced to fit the coupling capacitors into the same switch area without the coupling capacitors.

In a further embodiment the invention utilizes a trench implant layer in the semiconductor substrate that alleviates the problem of substrate charge build-up. In one embodiment the trench layer comprises means for capturing free carriers at the bulk substrate/buried oxide interface. The trench layer is typically implanted during the manufacturing process. This implanted trench layer captures the free carriers at the bulk substrate/buried oxide interface and so stops the charge build-up that creates the weak inversion layer. This improves the insertion loss performance of the RF switch and also reduces the generation of harmonic products.

In one embodiment the trench implant layer substantially surrounds at least one of the transistor switching elements.

In one embodiment at least one transistor comprises a connected drain-source resistor, Rds, to improve the linearity performance of the RF system. The use of the trench implant in RF switches yields improved switch performance in terms of insertion loss and linearity. The RF switch section consists of transistors that utilise drain-source resistors. The drain-source resistors improve the performance of the RF switch by increasing the linearity of the circuit.

In one embodiment the plurality of transistors are arranged in a stacked configuration.

In one embodiment at least one transistor element comprises a metal contact layer between source and drain regions using vias.

In one embodiment the metal interconnects to connect the drain of a first transistor to the source of the next transistor arranged in series.

In one embodiment a trench layer is positioned underneath the metal contact layers and/or metal interconnects tracks in the RF system.

In one embodiment said system comprises a digital control block and a negative voltage generator.

In one embodiment a filter comprises means to protect a digital control block and the negative voltage generator from high power high frequency signals present in the RF system.

In one embodiment the negative voltage generator comprises an oscillator circuit, a clock generator circuit and a charge pump.

In one embodiment the digital logic block comprises means to control the on-off state of the transistor elements of the RF system.

In a further embodiment of the present invention there is provided a Radio Frequency (RF) system comprising:
  a RF switch comprising a plurality of transistor switching elements implemented on a layer of Silicon on Insulator (SOI);
  a digital control block; and
  a negative voltage generator,
  wherein the layer of SOI comprises a trench implant layer to prevent unwanted substrate charge build-up.

In a further embodiment of the invention there is provided a method of manufacturing an RF system comprising the steps of:
  arranging a plurality of transistor switching elements implemented on Silicon on Insulator (SOI), said SOI comprises a bulk substrate region and a buried oxide region;
  positioning at least one filter adapted to isolate a RF signal from the substrate and/or other high frequency signals or control signals present in the RF system.

In a further embodiment there is provided a system comprising:
  a switch comprising a plurality of transistor switching elements implemented on a layer of Silicon on Insulator (SOI);
  said SOI layer comprises a bulk substrate region and a buried oxide region;
  wherein a trench implant layer is provided with means for capturing free carriers at the interface between the bulk substrate region and buried oxide region.

In another embodiment there is provided a system comprising:
  a switch comprising a plurality of transistor switching elements implemented on a layer of Silicon on Insulator (SOI);
  a digital control block; and
  a negative voltage generator,
  wherein at least one transistor comprises a connected drain-source resistor, Rds, to improve the linearity performance of the system.

In another embodiment there is provided a Radio Frequency (RF) system comprising:
  a RF switch comprising a plurality of transistor switching elements implemented on Silicon on Insulator (SOI) for switching at least one or more RF signals;
  said SOI comprises a bulk substrate region and a buried oxide region;
  a digital control block;
  a negative voltage generator characterised by:
  a trench implant layer adapted with means for capturing free carriers at the interface between the bulk substrate region and buried oxide region,
  at least one filter adapted to isolate the RF signal from the substrate, the digital control block and/or negative voltage generator.

In another embodiment there is provided a RF switch comprising a plurality of transistor switching elements implemented on a semiconductor substrate for switching at least one or more RF signals; characterised by at least one filter adapted to isolate the RF signal from the substrate and/or other high frequency signals or control signals present in the RF system. The semiconductor substrate can be any type of material, but preferably comprises SOI material.

BRIEF DESCRIPTION OF THE DRAWINGS

The present invention will be more clearly understood from the following description of an embodiment thereof, given by way of example only, with reference to the accompanying drawings, in which.

DETAILED DESCRIPTION OF THE DRAWINGS

Figure 1:
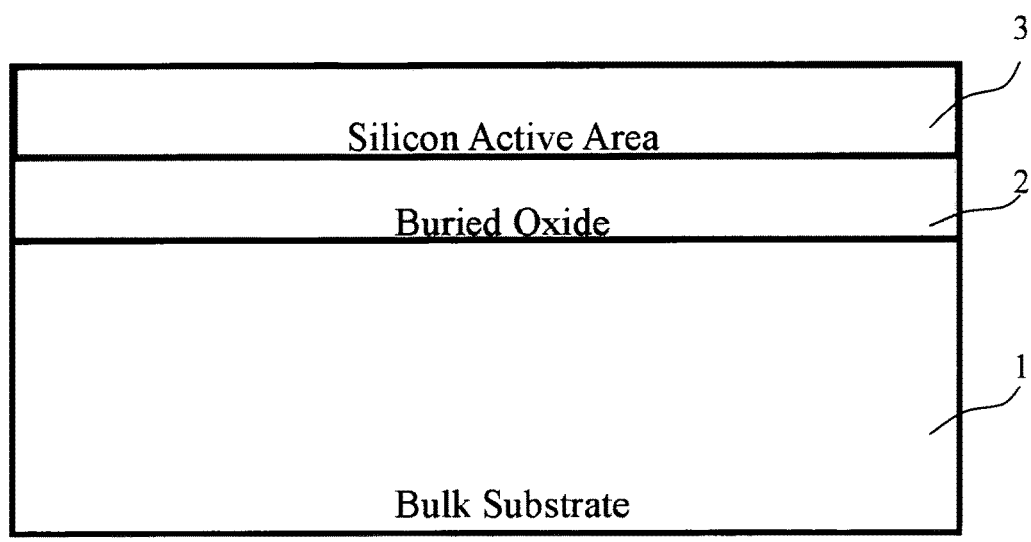
FIG. 1 illustrates a cross-sectional diagram of a typical SOI process.
Figure 2:
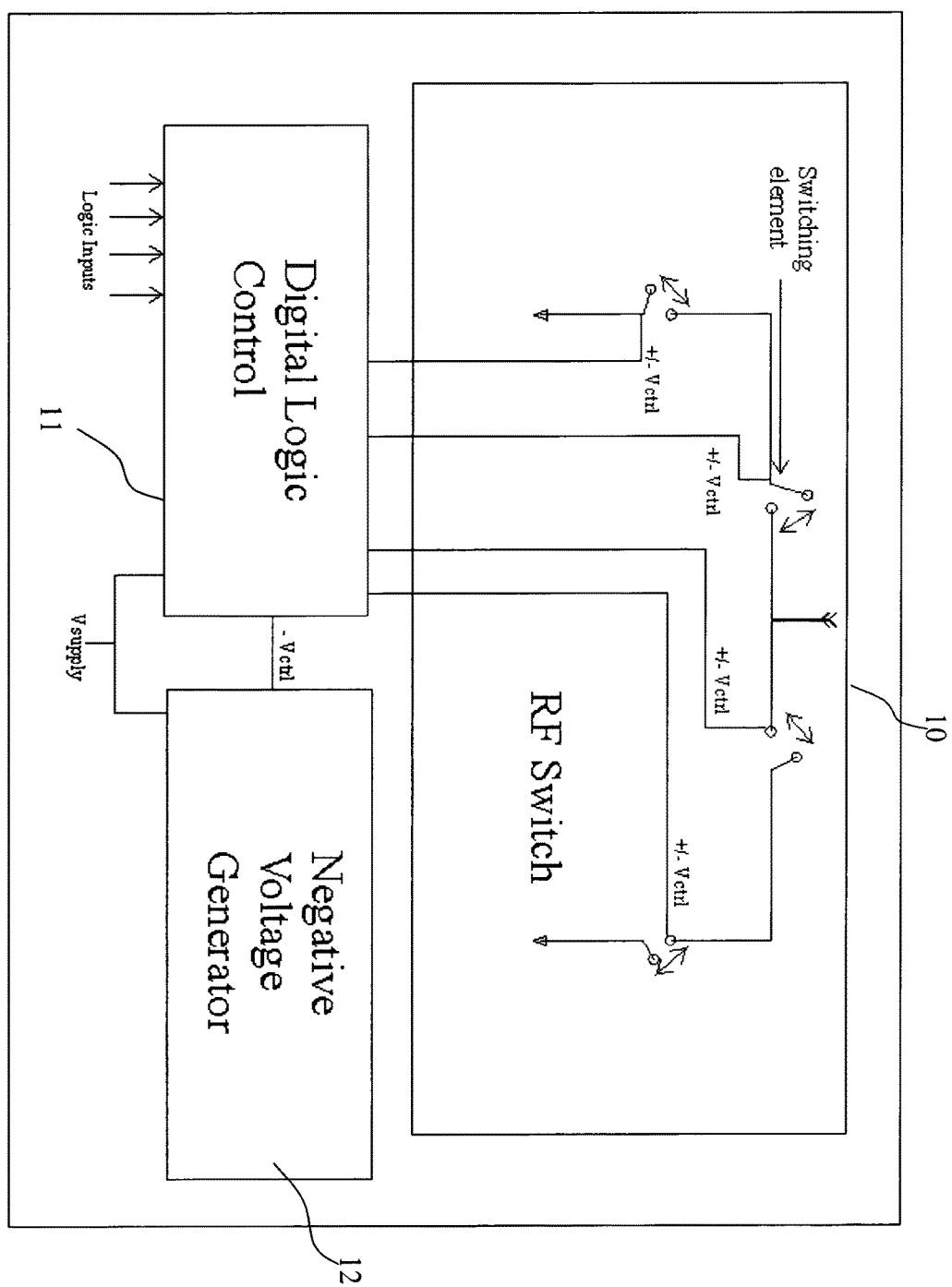
FIG. 2 illustrates in block diagram of the main elements of an RF switch system.

FIG. 1 illustrates a cross section of the principle elements of a typical SOI process. The SOI process consists of a thin silicon active area above an insulating layer. This insulating layer sits on top of a silicon substrate. A typical material for the insulating layer is silicon dioxide. In general SOI technologies consist of a bulk substrate 1, a buried oxide layer 2 and another thin active silicon layer 3. The bulk substrate 1 is generally a high resistivity substrate. The bulk substrate 1 can be either P-type or N-Type. A typical thickness for the bulk substrate is 250 µm. The buried oxide layer 2 is an insulator layer, typically silicon dioxide. A typical thickness of the buried oxide layer 2 is 1 um. The silicon layer 3 above the buried oxide is a thin layer of the order of 0.2 µm. FIG. 2 shows a block diagram of the principle elements of an RF switch system. A switch system consists of an RF switch section 10, a digital logic section 11 and a negative voltage generator section 12. The RF switch 10 shown is a single pole two throw (SP2T) switch. The switch has four switching elements. Each switching element can be turned on or off. Ideally, when the switch 10 is on it behaves as a short circuit and when it is off it behaves as an open circuit. The on/off state of each switching element is controlled by DC voltages from the digital logic control block. The logic inputs are used to control what control voltage is applied to each switching element. To meet required performance levels in RF switch design a negative voltage is needed to control the off state of the switching element. This negative voltage is supplied by the negative voltage generator 12. The negative voltage generator 12 supplies the digital control block with a constant negative DC voltage. This negative DC voltage, along with the positive supply voltage, is then used by the digital control block 11 to control the switching elements.

Figure 3:
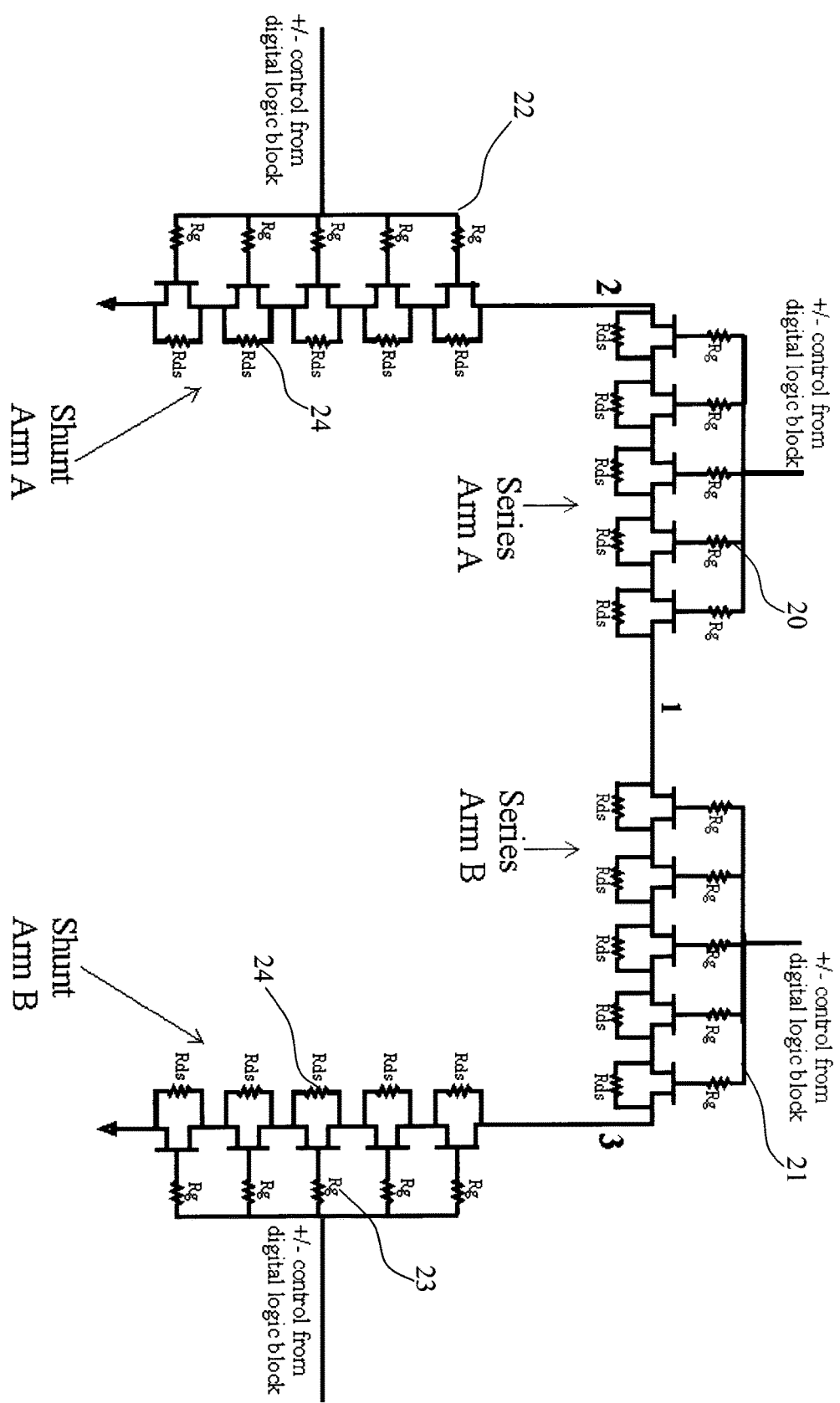
FIG. 3 illustrates an implementation of an RF switch containing two series and two shunt arms.

A typical example of an RF switch section is illustrated in FIG. 3. This figure shows a single pole two throw switch. It contains two series arms 20, 21 and two shunt arms 22 23. The series arms 20, 21 are used to control the flow of RF signals between different points of the RF system. The shunt devices 22, 23 are used to improve the RF performance of the circuit by increasing the isolation. The single pole two throw switch functions as follows: when series arm 20 is on, series arm 21 is off, shunt arm 22 is off and shunt arm 23 is on. The on/off state of each arm is controlled by positive and negative voltages from the digital control block. The positive and negative control voltages are applied to the gates of the transistors of each arm through large resistors (Rg). One important aspect of the present invention is the provision of drain-source resistors, Rds, 24 that are used on each transistor in the switch circuit. These Rds resistors 24 are used to improve the linearity performance of the switch circuit.

As shown in FIG. 3 each switching element of the switch circuit consists of five transistors connected is series. This series connection of transistors is known as "stacking". Multiple transistors are stacked in this manner to design a switch that can operate under high voltage conditions. This idea behind using stacked transistors is to replace the single transistors in the switch by a series of two or more transistors. As a result, if m transistors are used in the stack, then the voltage seen across the source and drain of each of the transistors will be distributed evenly and will be reduced by a factor m.

However, the system can contain any number of transistors without deviating from the scope of this invention. An arm is turned on by the application of a positive voltage to the gate resistors, Rg, of the transistors of the particular arm. In the case of series arm 20 application of a positive voltage creates a low resistance path between node 1 and node 2. The lower the resistance of this path the less RF power is lost when a signal travels from node 1 to node 2. The amount of signal power lost between node 1 and node 2 is known as the insertion loss of the switch.

Figure 4:
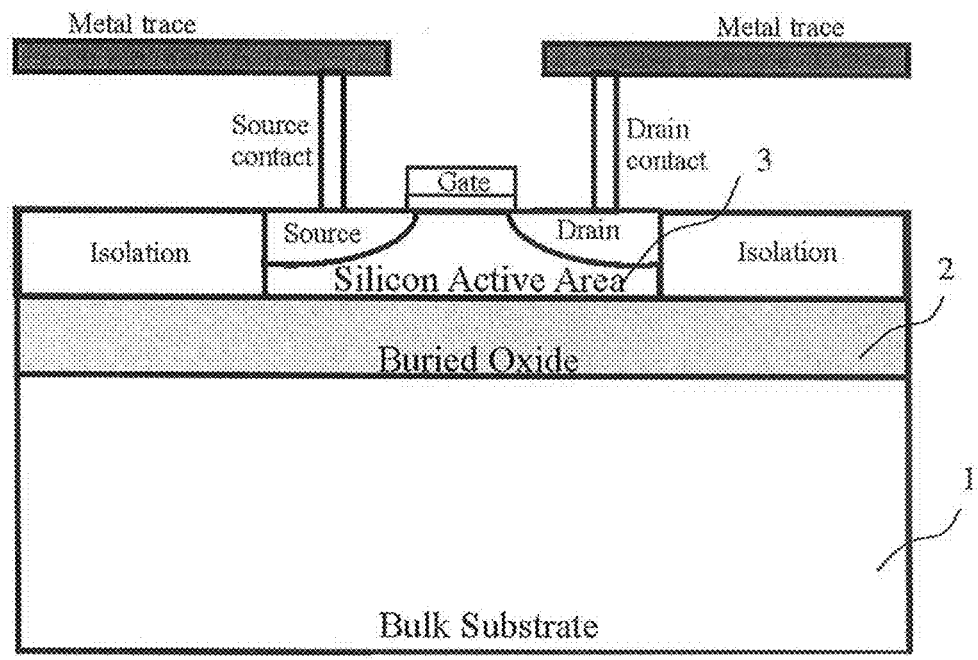
FIG. 4 illustrates a cross-sectional diagram of a single NMOS transistor implemented in a standard SOI process.

As shown in FIG. 4 transistors are made in the thin active layer of the process. The transistor consists of drain, source and gate regions, gate dielectric and a channel region. The source and drain regions are created in this thin silicon layer using a suitable heavy dopant. The channel region is the area of active silicon between the source and drain. The gate dielectric is formed over the channel region. Isolation implants can also be implanted in areas of unused active silicon. Contact to the source and drain regions can be made using vias that connect to the processes' metal layers.

Figure 5:
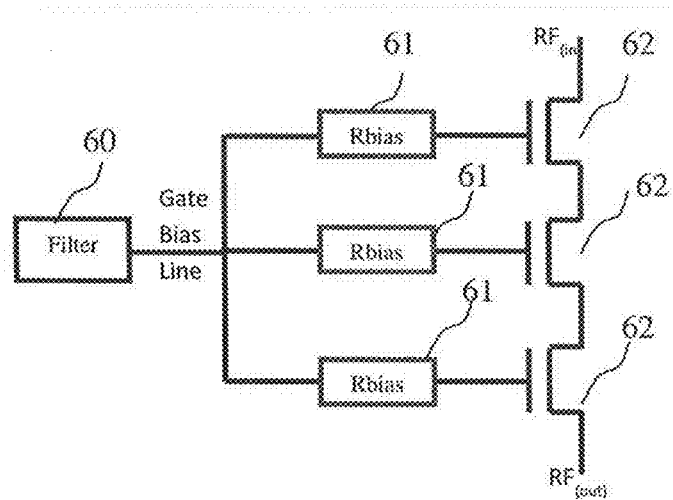
FIG. 5 illustrates the combination of a filter, a rf bias resistor and switch or shunt transistor, according to a preferred embodiment of the invention.
Figure 6:
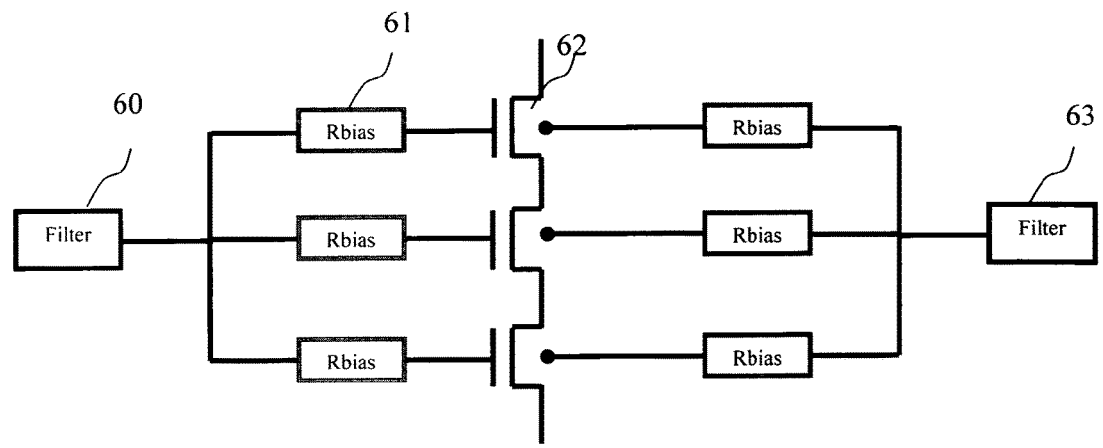
FIG. 6 illustrates a filter and bias resistor on both the gate and body of the switch or shunt transistor, according to another embodiment of the invention.

FIG. 5 shows the placement of a filter 60 before a number of bias resistors 61 on the gate of a number of transistors 62 of one of the arms shown in FIG. 3, according to a preferred embodiment of the invention. The bias resistor 61 is typically a large value of ~50-100k Ohms but is limited in how large it can be by the switching time requirements of the switch. As a result of this limitation some RF power will leak through the resistors to the gate bias line. This RF power can couple to the substrate from the gate bias line or couple to another bias line on the chip resulting in non-linearities in the switch behaviour. The filter 60 attenuates this RF power/voltage to isolate the RF signal from the substrate and/or other high frequency signals or control signals present in the RF system. FIG. 6 is similar to FIG. 5 except there is a filter placed on the body contact as well as the gate. The additional body contact improves the transistor linearity but this benefit can be lost if a filter is not present.

Figure 7:
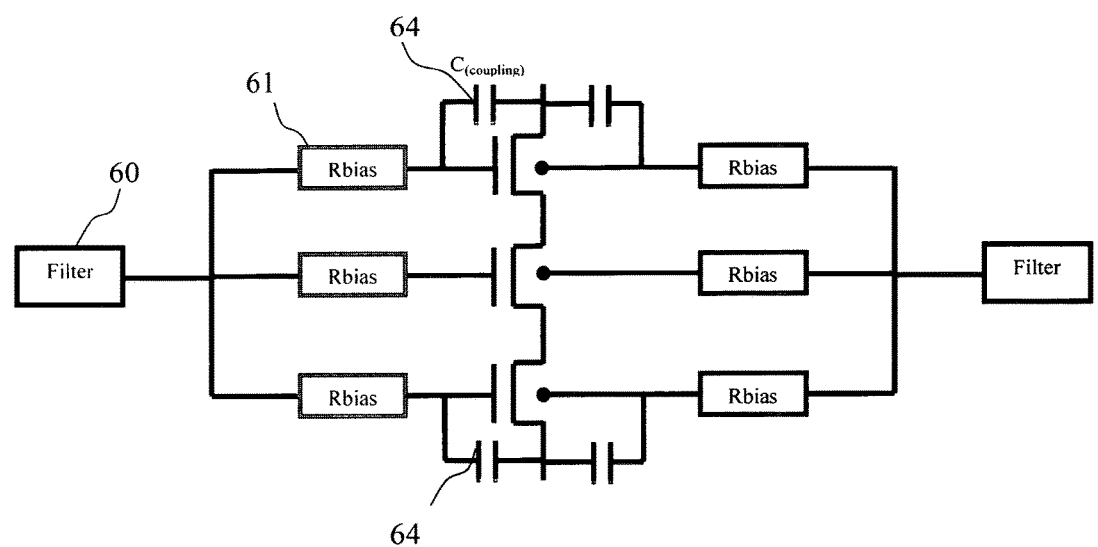
FIG. 7 illustrates a filter with a bias resistor and a coupling capacitor on the gate to drain, gate to source, body to drain and body to source terminals.

FIG. 7 shows the addition of a coupling capacitor 64 to the transistors 62 at each end of a switch arm. FIG. 7 illustrates the filter with the bias resistor and the coupling capacitor on the gate to drain, gate to source, body to drain and body to source terminals. The capacitor 64 will feed more of the RF voltage to the transistor gate and body. This is advantageous for the transistor since the change in bias with incoming RF power will reduce the voltage differentials on the transistor and help it's response to be more linear. However, without the presence of the filter 60 more RF power would also be coupled to the bias line adding non-linearities elsewhere in the DC and analog circuits or through coupling to the substrate through the bias lines.

Figure 8:
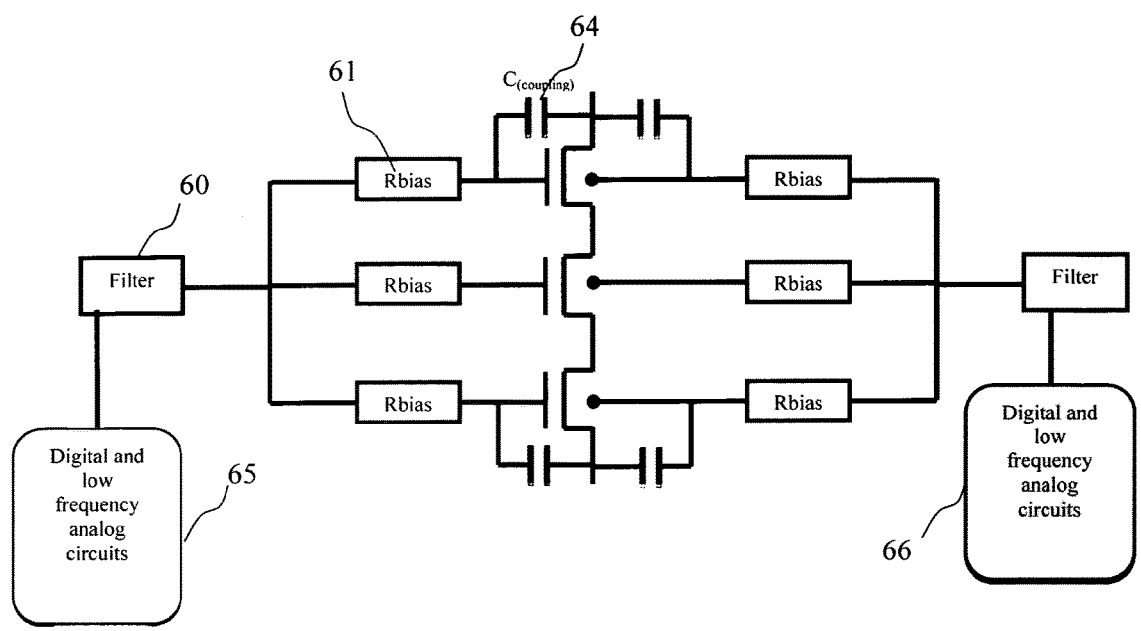
FIG. 8 shows a filter blocking RF signals from reaching the digital logic blocks and the positive and negative power supplies.

FIG. 8 is similar to FIG. 7 but shows how the filters isolate the digital and low frequency analog circuits 65 and 66 from the RF power which will improve linearity. FIG. 8 shows the filter 60 blocking RF signals from reaching the digital logic blocks 65 and the positive and negative power supplies 66.

Figure 9:
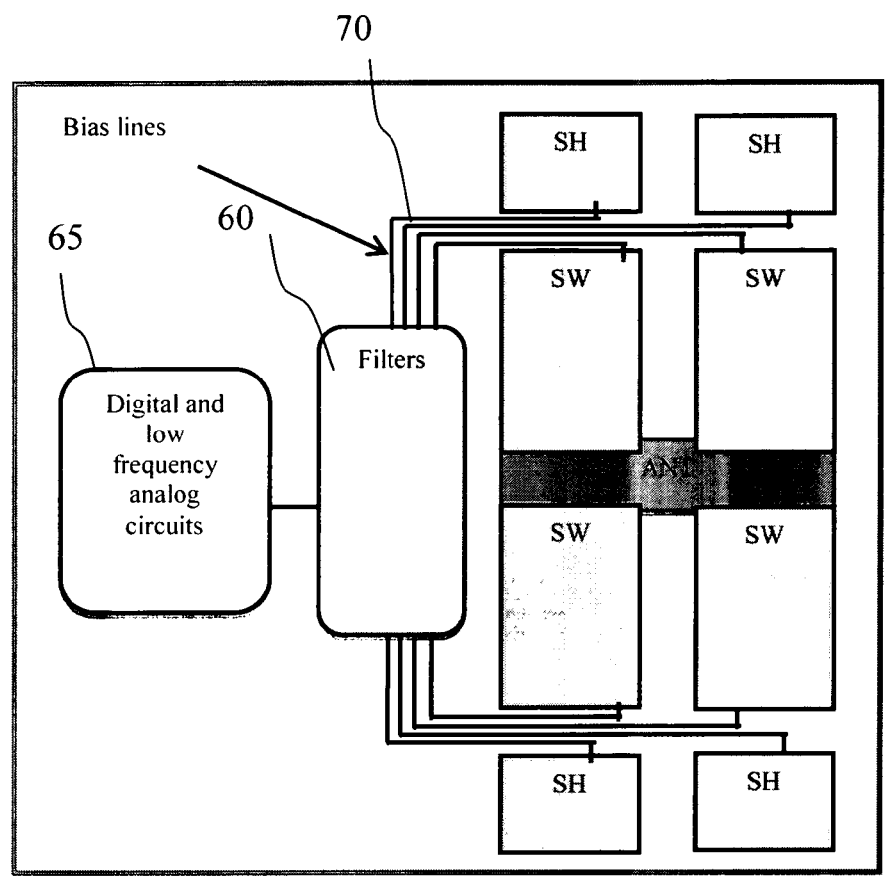
FIG. 9 illustrates an embodiment of a centralized filter bank according to another aspect of the invention.

FIG. 9 shows one possible implementation of the filters 60 which are located together and in close proximity to the digital and low frequency analog circuits 65. FIG. 9 illustrates how bias lines 70 run around the chip and can create coupling according to one embodiment. The bias lines 70 are designed to be relatively long can run for approximately a millimetre in length around the chip. Without the presence of an RF filter 70 significant rf voltage would be present on the bias lines and would couple to other bias lines or to the substrate which would cause non linearities in the switch characteristics. The design of the filter 60 significantly reduces the voltage swings on the bias lines 70.

Figure 10:
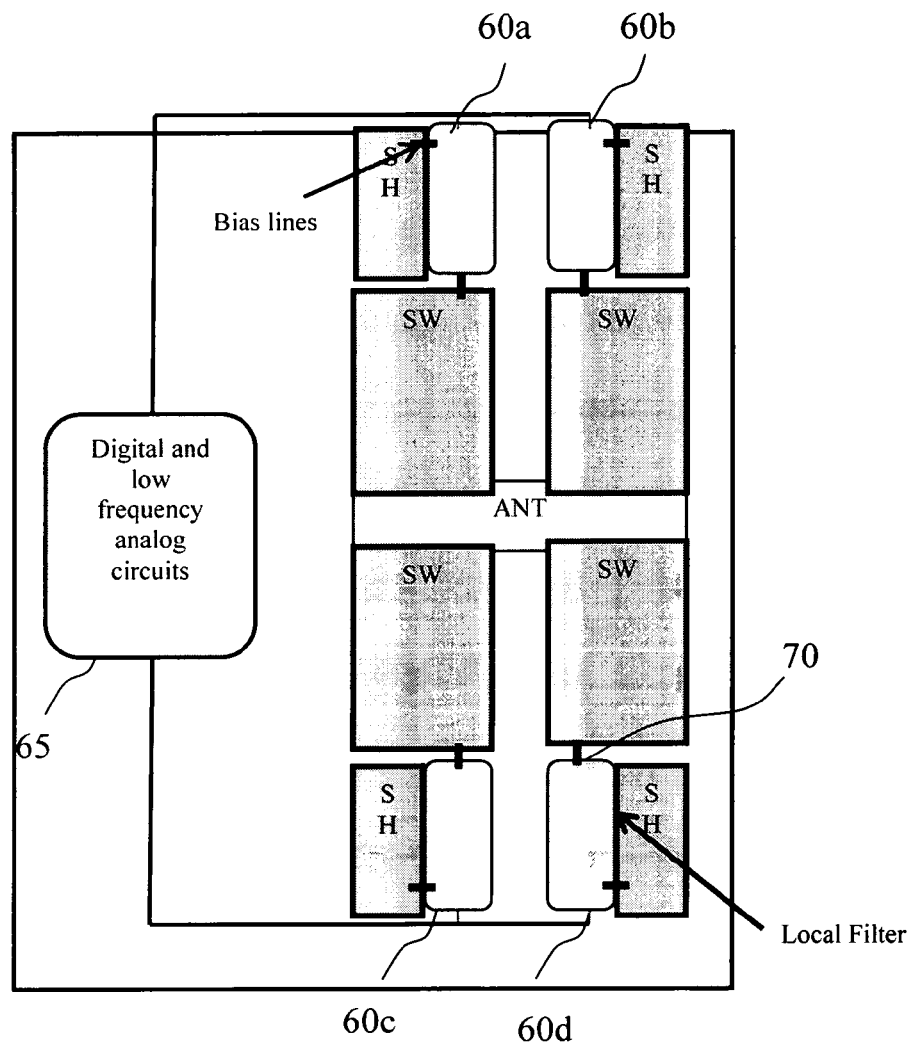
FIG. 10 illustrates the concept of a local filter per switch according to one embodiment of the invention.

FIG. 10 shows another implementation where filters 60a, 60b, 60c and 60d (and associated circuits) are placed local to each switch. FIG. 10 illustrates how the local filter architecture removes the long bias lines, according to one embodiment. FIG. 10 shows how local filters are used to reduce any rf voltage on the bias lines but more importantly dramatically reduce the length of the bias lines themselves thus eliminating any possibility of coupling to neighbouring bias lines or the substrate which will result in superior linearity in the switch. The local filter architecture eliminates the long bias lines on the IC chip eliminating any possibility of rf coupling to each other or to the substrate.

Figure 11:
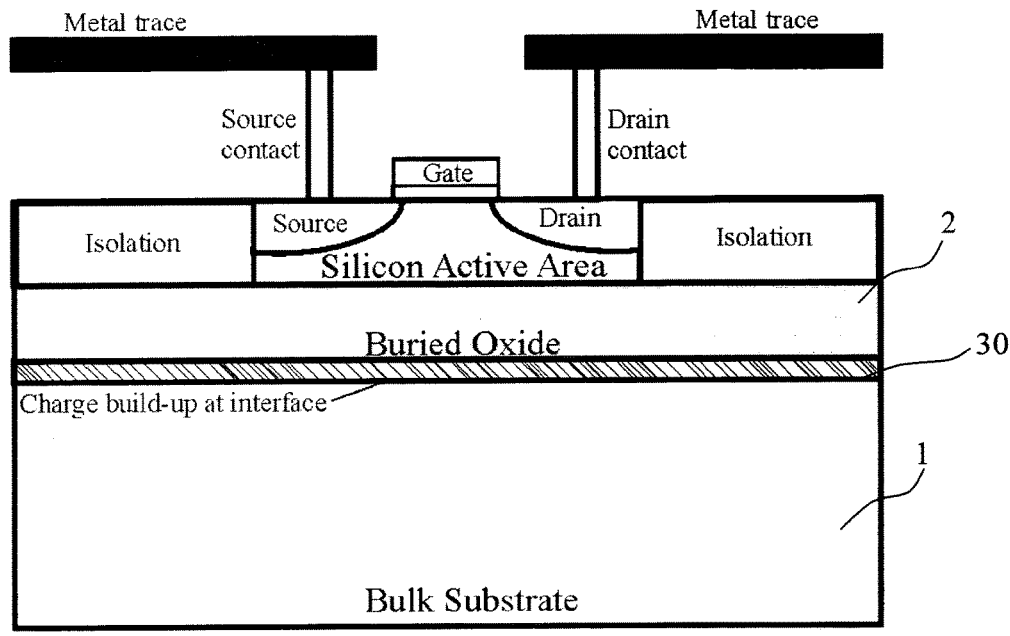
FIG. 11 illustrates a cross-sectional diagram of the charge build up in the substrate, occurring at the interface between the bulk substrate and the buried oxide.
Figure 12:
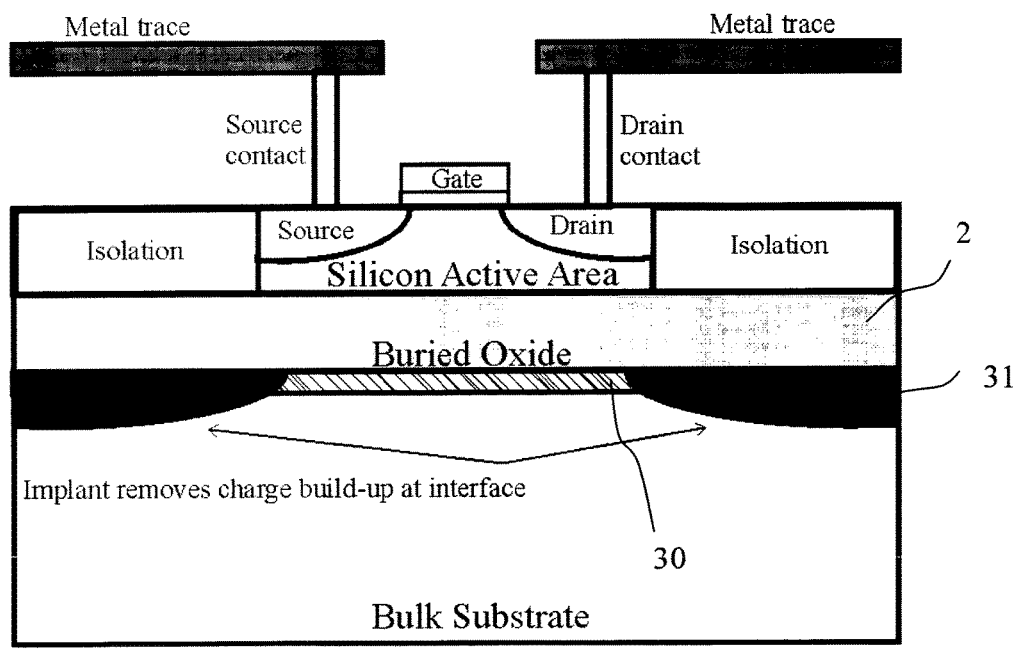
FIG. 12 illustrates a cross-sectional diagram of the trench implants that are used to remove the charge build-up in the substrate of an RF system according to one aspect of the invention.

FIG. 11 shows the region where charge build-up can occur in an SOI process indicated generally by the reference numeral 30. Free carriers in the bulk substrate form a weak inversion layer 30 at the interface between the bulk substrate 1 and the buried oxide layer 2. This weak inversion layer 30 has adverse affects on the RF performance of a switch circuit. It results in a varying parasitic capacitance over the RF cycle that creates unwanted harmonic products and increases insertion loss of the switch circuit. This seriously impacts the usefulness of SOI as a process for the design of RF switches. However, an important aspect of the invention is that the effects of this inversion layer can be reduced by using a trench implant layer 31. This is illustrated in FIG. 12. The trench layer 31 is typically implanted during the manufacturing process has means for capturing the free carriers at the bulk substrate/buried oxide interface and so stops the charge build-up that creates the weak inversion layer 30. This improves the insertion loss performance of the RF switch and also reduces the generation of harmonic products. The trench implant layer process was developed to reduce harmonic distortion caused by substrate-circuit interactions. The trench is built after the transistors have been formed. This is achieved by etching down to the substrate where active devices are not present and implanting the substrate to create damage which will inhibit the formation of mobile electrons at the substrate interface.

Figure 13:
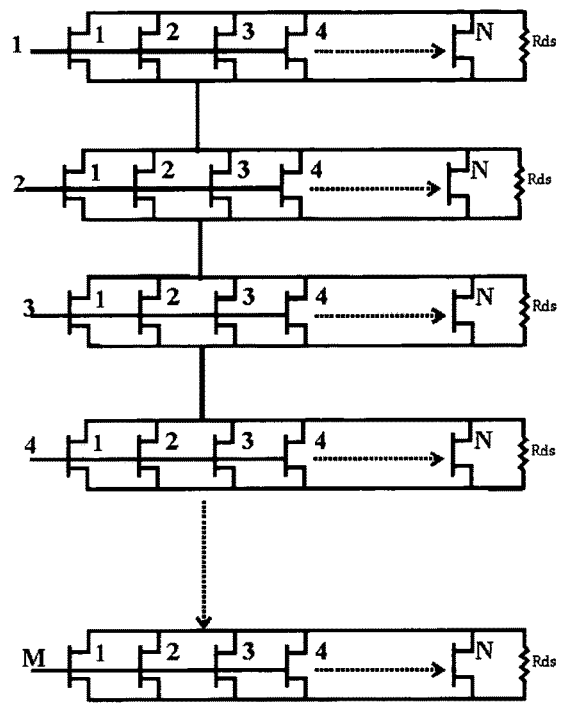
FIG. 13 shows a circuit level implementation of a switch arm where a number of transistors are connected together in series and parallel.

As shown in FIG. 3 typical RF switch applications utilise a number of transistors connected in series. This is done so that the switch circuit can operate under high voltage conditions. Typical switch designs also utilise a number of transistors connected in parallel. FIG. 13 shows a typical implementation of a single arm of a switch circuit. As illustrated there are M transistors connected, or stacked, in series. M can be any number depending on the particular design requirements. Each series transistor in the stack of M transistors can themselves be made up of N transistors connected in parallel. N can be any number depending on the particular design requirements. However the weak inversion layer 30 has adverse affects on the RF performance of a transistors, resulting in a varying parasitic capacitance over the RF cycle that creates unwanted harmonic products and increases insertion loss of the switch circuit as outlined above.

Figure 14:
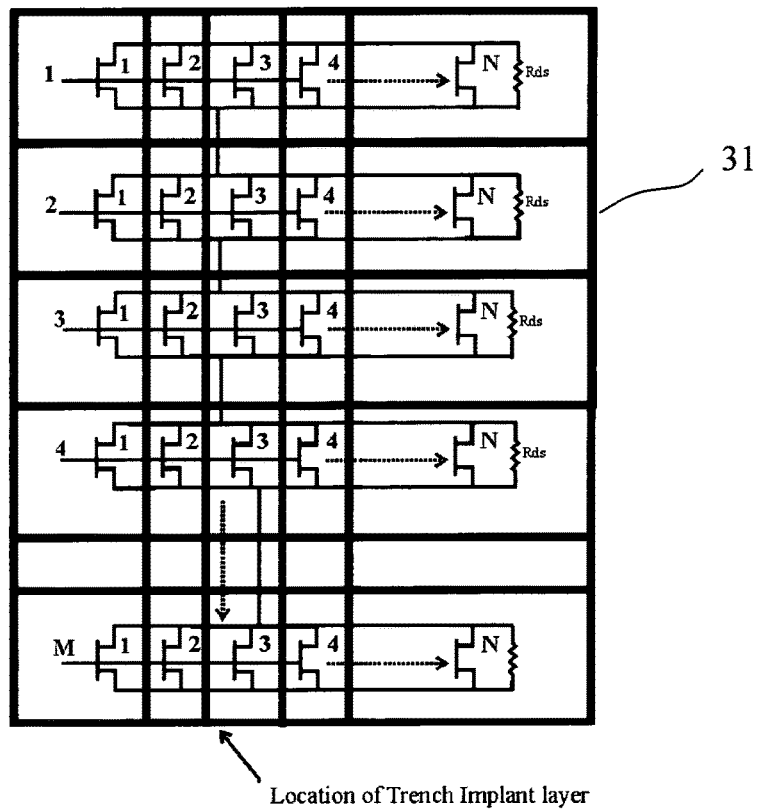
FIG. 14 shows the same transistor level implementation of a switch arm as in FIG. 13 except in this case the location of the trench layer implants is shown.
Figure 15:
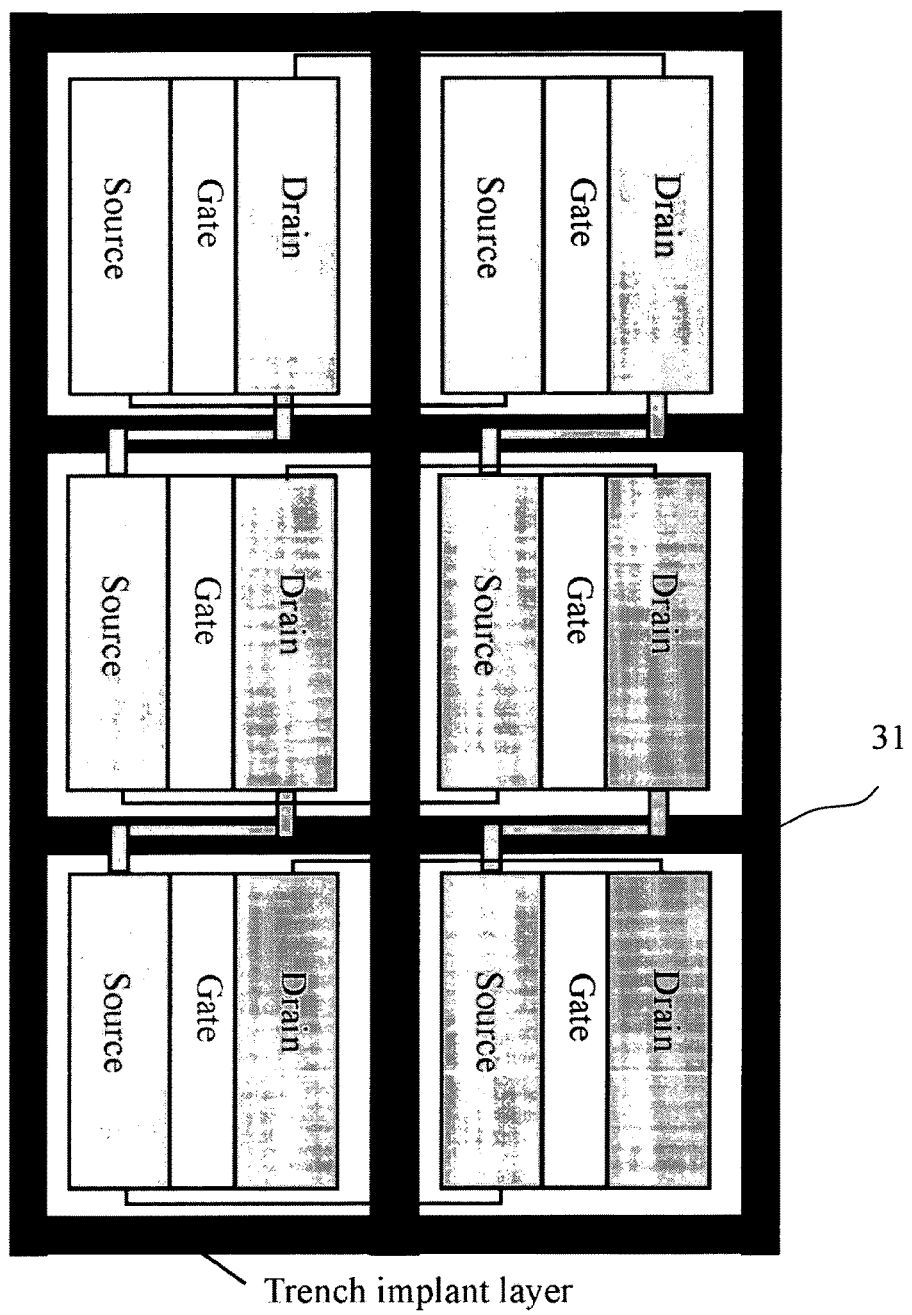
FIG. 15 shows a layout view of a typical switch arm.

FIG. 14 shows the same implementation as FIG. 15 except in this case the trench implant layer 31 is utilized. As can be seen the trench layer 31 surrounds each of the parallel transistors from 1 to N and each of the stacked cells from 1 to M. The trench layer improves the insertion loss performance of the RF switch and also reduces the generation of harmonic products.

Figure 16:
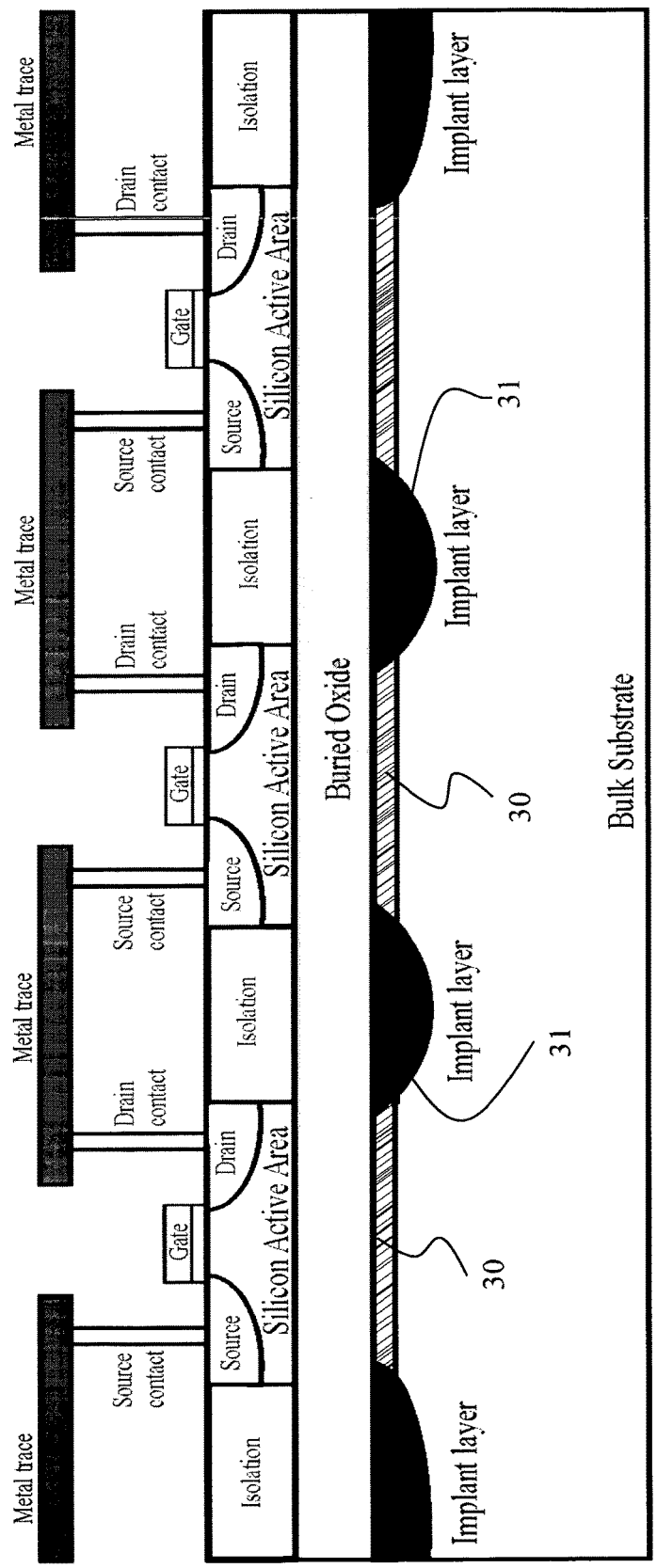
FIG. 16 illustrates a cross-sectional diagram of the switch implementation of FIG. 15.

FIG. 15 shows a layout view of three of the M series transistors and two of the N parallel transistors of FIG. 4. As can be seen each transistor is completely surrounded by the trench implant layer 31. FIG. 16 shows a cross-section of FIG. 15. Metal interconnects are used to connect the drain of each transistor to the source of the next series transistor. A trench implant is used underneath each of these metal interconnects and between each transistor in the stack. Those skilled in the basic art of RF switch layout will see that many similar layout implementations are possible while not deviating significantly from the invention described here.

Figure 17:
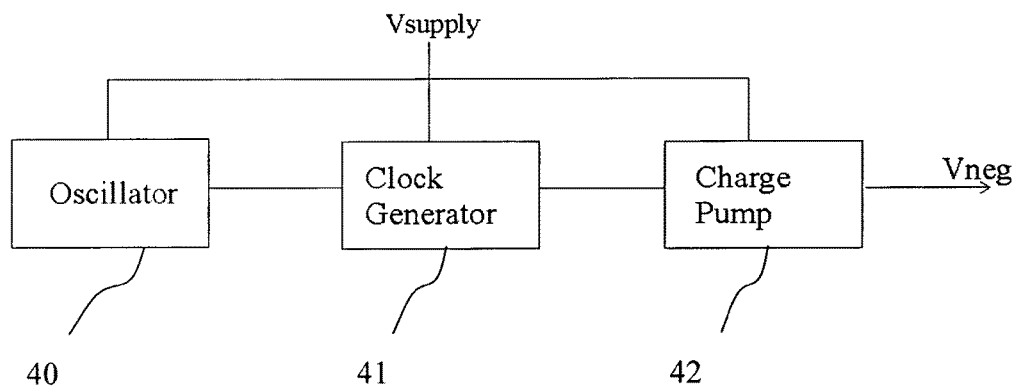
FIG. 17 illustrates a block diagram of the principle elements of the negative voltage generator block.

As shown in FIG. 2 as well as the RF switch itself is a complete switch system comprised of a digital block and negative voltage generator block 12. FIG. 17 shows a block diagram of the principle elements of a negative voltage generator. The negative voltage generator 12 contains an oscillator circuit 40, a clock generator circuit 41 and a charge pump 42. As stated already the arms of the RF switch need to be turned on and off at various times. For many applications a negative voltage is required to turn the transistor arm off. This is due to high power nature of certain applications and also to the stringent linearity requirements that must be met.

Figure 18:
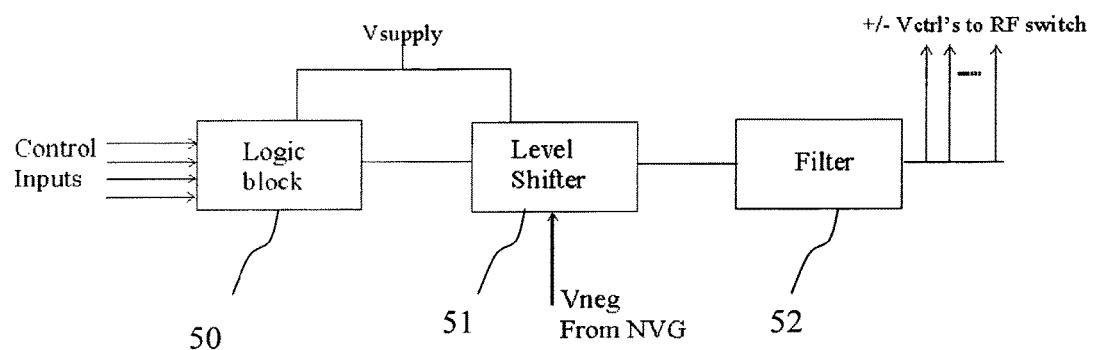
FIG. 18 illustrates a block diagram of the principle elements of the digital control block.

FIG. 18 shows a block diagram of the principle elements of the digital control block 11. The digital logic block in its simplest form is comprised of a decoder circuit 50, level shifter 51 and a filter 52, which functions in the same way as the filter 60 described above. The level shifter 51 takes the negative voltage generated in the negative voltage generator as one of its inputs. The filter 52 prevents unwanted high power RF signals from the RF switch from damaging the digital logic blocks and the negative voltage generator block. The function of the digital logic block is to control the on-off state of the transistor arms of the RF switch. The RF transistors operate under high power conditions. Under certain operating conditions the level shifter can be exposed to these high power RF signals. The filter 52 is positioned between the level shifter outputs and the gate resistors of the RF transistors. The filter 52 functions by blocking any RF signals from reaching the level shifter and so protect the circuitry from damage.

It will be appreciated that in the context of the present invention SOI is a preferred substrate to bring the invention into effect, however it is envisaged any type of semiconductor substrate can be used that is suitable for making a RF switching system as hereinbefore described with respect to the description and/or figures.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A Radio Frequency (RF) system comprising:
a RF switch comprising a plurality of transistor switching elements implemented on Silicon on Insulator (SOI), each transistor switching element having a resistor coupled to a gate region of the transistor switching element;
a digital control block configured to control an on-off state of the transistor switching elements; and
a filter coupled between the digital control block and a gate of each of the transistor switching elements;
wherein each filter is configured to block unwanted high power RF voltage signals from the RF switch from reaching the digital control block and to reduce non-linearities in the RF switch.

2. The RF system of claim 1 wherein a coupling capacitor is adapted to cooperate with said at least one filter to improve linearity of the transistor switch elements.

3. The RF system as claimed in claim 2 wherein a width of a first transistor in the RF switch is reduced to fit the coupling capacitor into the same switch area as an RF switch without the coupling capacitor.

4. The RF system as claimed in claim 1 comprising a trench implant layer adapted with means for capturing free carriers at an interface between a bulk substrate region and a buried oxide region.

5. The RF system as claimed in claim 1 wherein the at least one filter is coupled to a gate bias line of at least one of said transistor switching elements.

6. The RF system as claimed in claim 1 wherein the at least one filter is coupled to a gate bias line and body bias line of at least one of said transistor switching elements.

7. The RF system as claimed in claim 1 wherein gate and body bias signals are connected to the at least one filter which is connected to a bias resistor and connected to the source or drain of the switch transistor through a capacitor.

8. The RF system as claimed in claim 1 wherein partial filtering occurs locally at least one of the transistor switching elements.

9. The method of claim 8, wherein the RF system comprises a negative voltage generator block, wherein further filtering occurs at the digital control block and at the negative voltage generator block.

10. The RF system as claimed in claim 1 wherein at least one transistor comprises a connected drain-source resistor (RDS) to improve the linearity performance of the RF system.

11. The RF system of claim 10 comprising metal interconnects to connect a drain of a first RDS transistor to a source of a next RDS transistor, the RDS transistors arranged in a series.

12. The RF system of claim 10 comprising metal interconnects to connect a drain of a first RDS transistor to a source of a next transistor, the RDS transistors arranged in a series, wherein at least one RDS transistor comprises a metal contact layer between the source and the drain regions and wherein a trench layer is positioned underneath the metal contact layers and/or metal interconnects tracks in the RF system.

13. The RF system as claimed in claim 12 wherein the trench layer substantially surrounds at least one of the transistor switching elements.

14. The RF system of claim 1 wherein the plurality of transistors are arranged in a stacked configuration.

15. The RF system of claim 1 wherein said RF system comprises a negative voltage generator.

16. The RF system as claimed in claim 1 wherein said RF system comprises a negative voltage generator and the at least one filter comprises means to isolate the digital control block and the negative voltage generator from high power high frequency signals present in the RF system.

17. The RF system as claimed in claim 1 wherein said RF system comprises a negative voltage generator, the negative voltage generator comprises an oscillator circuit, a clock generator circuit and a charge pump.

18. The RF system as claimed in claim 1 wherein RF said system comprises a negative voltage generator, the digital control block comprises means to control the on-off state of the transistor elements of the RF system.

19. A method of manufacturing the RF system of claim 1, the method comprising the steps of:
arranging the plurality of transistor switching elements implemented on Silicon on Insulator (SOI); and
positioning the filter.

20. The method of claim 19 comprising the step of implanting a trench implant layer between said substrate and buried oxide region for capturing free carriers at an interface between a bulk substrate region and a buried oxide region.

21. The method of claim 19 comprising the step of implanting a trench implant layer wherein the trench implant layer substantially surrounds at least one of the transistor switching elements.

22. A Radio Frequency (RF) system comprising:
a RF switch comprising a plurality of transistor switching elements implemented on Silicon on Insulator (SOI), each transistor switching element having a resistor coupled to a gate region of the transistor switching element;
a digital control block; and
a negative voltage generator;
the system characterised by:
the digital control block being configured to control an on-off state of the transistor switching elements, the digital control block comprising a decoder circuit,
a level shifter configured to receive negative voltage generated in the negative voltage generator, and
a filter positioned between the outputs of the level shifter and the resistors coupled to the gate regions of each of the transistor switching elements,
wherein each filter is configured to block unwanted high power RF signals from the RF switch from reaching the level shifter, the decoder circuit, and the negative voltage generator and to reduce non-linearities in the RF switch, and wherein at least one transistor comprises a connected drain-source resistor (RDS) to improve linearity performance of the RF system.

23. A Radio Frequency (RF) system comprising:

a RF switch comprising a plurality of transistor switching elements implemented on Silicon on Insulator (SOI) substrate for switching at least one or more RF signals, said SOI comprising a bulk substrate region and a buried oxide region;

a digital control block configured to control an on-off state of the transistor switching elements;

a filter coupled to a gate bias line of each of said transistor switching elements, the filter adapted to block unwanted high power RF signals from the RF switch from reaching the digital control block; and a filter coupled to a body bias line of each of said transistor switching elements, the filter adapted to block unwanted high power RF signals from the RF switch from reaching the digital control block and to reduce non-linearities in the RF switch.

* * * * *